(12) United States Patent
Duenkel et al.

(10) Patent No.: US 10,176,859 B2
(45) Date of Patent: Jan. 8, 2019

(54) NON-VOLATILE TRANSISTOR ELEMENT INCLUDING A BURIED FERROELECTRIC MATERIAL BASED STORAGE MECHANISM

(71) Applicant: GLOBALFOUNDRIES Inc., Grand Cayman (KY)

(72) Inventors: Stefan Duenkel, Dresden (DE); Ralf Illgen, Dresden (DE); Ralf Richter, Radebeul (DE); Soeren Jansen, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/585,709

(22) Filed: May 3, 2017

(65) Prior Publication Data

US 2018/0322912 A1 Nov. 8, 2018

(51) Int. Cl.
| | |
|---|---|
| *G11C 16/24* | (2006.01) |
| *G11C 11/22* | (2006.01) |
| *H01L 29/78* | (2006.01) |
| *G11C 16/04* | (2006.01) |
| *G11C 16/06* | (2006.01) |

(52) U.S. Cl.
CPC ........ *G11C 11/225* (2013.01); *G11C 16/0466* (2013.01); *G11C 16/06* (2013.01); *H01L 29/7841* (2013.01); *H01L 29/78391* (2014.09)

(58) Field of Classification Search
CPC ... G11C 11/225; G11C 16/0466; G11C 16/06; H01L 29/78391; H01L 29/7841
See application file for complete search history.

(56) References Cited

U.S. PATENT DOCUMENTS

| | | | |
|---|---|---|---|
| 7,157,773 B2* | 1/2007 | Kato | H01L 21/28282 257/324 |
| 9,865,608 B2* | 1/2018 | Mueller | H01L 27/11507 |
| 2015/0171183 A1* | 6/2015 | Sakai | H01L 21/28291 257/295 |
| 2016/0064510 A1* | 3/2016 | Mueller | H01L 29/516 257/295 |
| 2018/0040731 A1* | 2/2018 | Flachowsky | H01L 21/02181 |

* cited by examiner

*Primary Examiner* — Toan K Le
(74) *Attorney, Agent, or Firm* — Amerson Law Firm, PLLC

(57) ABSTRACT

The present disclosure provides storage elements, such as storage transistors, wherein at least one storage mechanism is provided on the basis of a ferroelectric material formed in the buried insulating layer of an SOI transistor architecture. In further illustrative embodiments, one further storage mechanism is implemented in the gate electrode structure, thereby providing increased overall information density. In some illustrative embodiments, the storage mechanism in the gate electrode structure is provided in the form of a ferroelectric material.

20 Claims, 2 Drawing Sheets

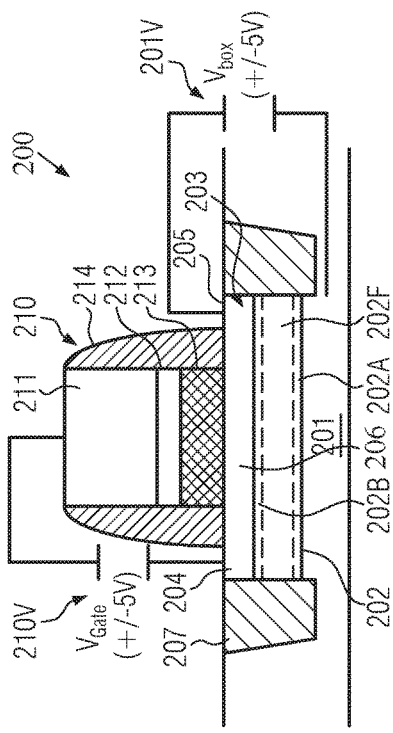
FIG. 1A
(Prior Art)
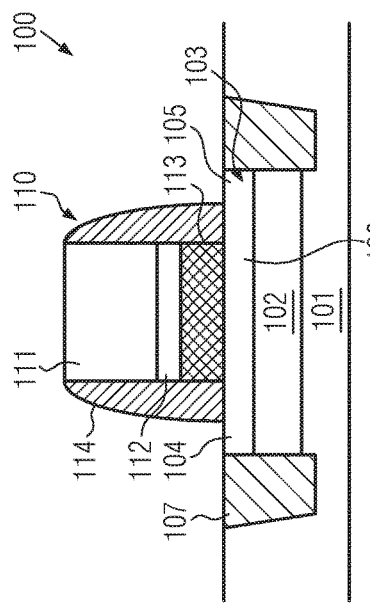
FIG. 1B
(Prior Art)
FIG. 1C
(Prior Art)
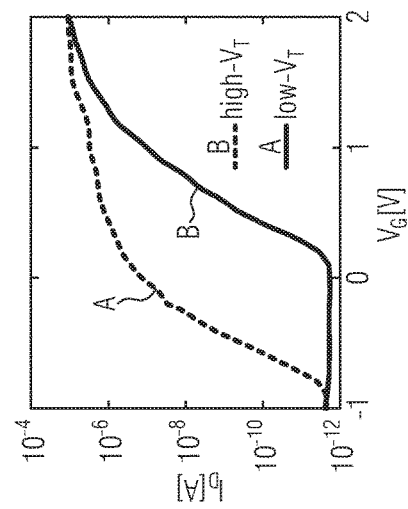
FIG. 2
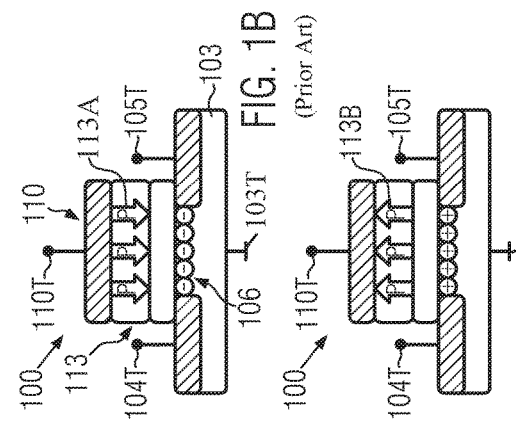
FIG. 1D
(Prior Art)

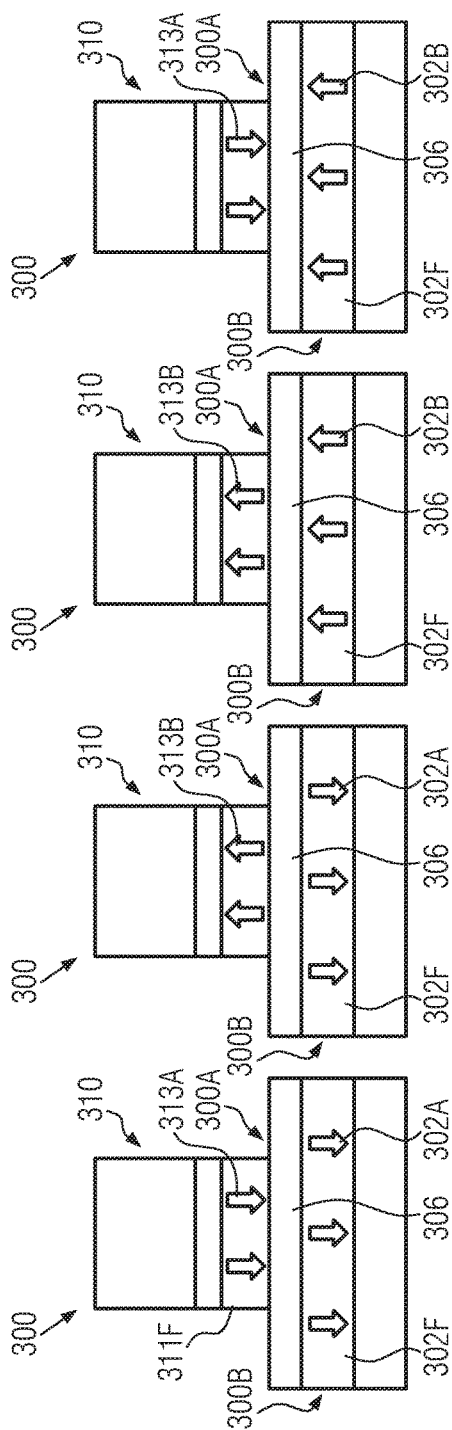
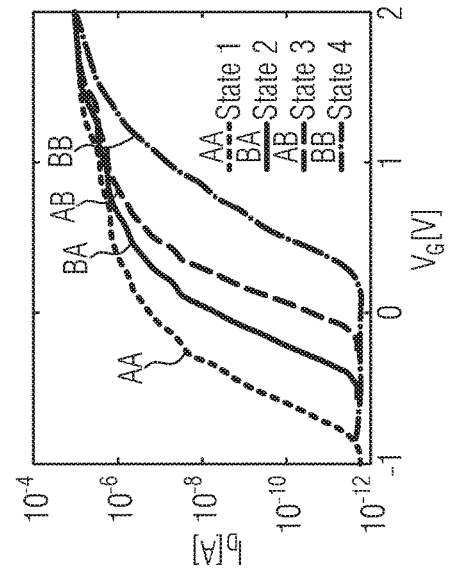
FIG. 3A FIG. 3B FIG. 3C FIG. 3D
FIG. 3E

NON-VOLATILE TRANSISTOR ELEMENT INCLUDING A BURIED FERROELECTRIC MATERIAL BASED STORAGE MECHANISM

BACKGROUND

1. Field of the Disclosure

Generally, the present disclosure relates to techniques for providing a non-volatile storage mechanism in a circuit element, such as a field effect transistor, by taking advantage of the characteristics of a ferroelectric material.

2. Description of the Related Art

In many types of electronic components, data storage techniques may have to be implemented in order to guarantee the proper functioning of a respective technical system. For example, in many applications, different types of information have to be processed and, therefore, stored, which is typically accomplished on the basis of digital data. A basic entity of information may be considered as an entity having the capability of taking on different logic states so that implementation of respective logic states in hardware requires an appropriate electronic configuration that is capable of "occupying" respective different physical states, such as different voltage states, current states and the like, which, in turn, may be appropriately associated with the respective logic states.

These different physical states, mostly implemented in the form of different electronic states in sophisticated integrated circuits, may, therefore, be efficiently detected upon providing an appropriate electronic infrastructure so as to allow the reliable detection of respective different characteristics, such as the state of charge of a capacitor, the amount of current flow in a respective conductor, such as the channel region of a field effect transistor and the like. Consequently, upon appropriately manipulating the respective electronic characteristic, such as the state of charge, the current drive capability and the like, a respective electronic state and thus logic state may be programmed into the underlying electronic structure, wherein, depending on the overall configuration of the basic electronic structure, the respective electronic characteristic and thus the logic state may be programmed to be permanently stored, i.e., the corresponding electronic characteristic may be efficiently restored after shutting off the power supply and repowering the respective structure, while, in other cases, the respective electronic characteristic and thus the logic state associated therewith may only be obtained while supply voltage is present, and the corresponding information may be lost upon shutting off the supply voltage. The former storage mechanism may also be referred to as "non-volatile," while, in the context of the present application, this term may mainly be used to describe storage mechanisms, which may also allow frequent reprogramming of a corresponding storage mechanism compared to mechanisms in which a respective programming of information may be based on a one-time procedure implemented on the basis of a substantially irreversible process. For implementing non-volatile storage mechanisms as defined in the above sense and volatile storage mechanisms, a wide variety of electronic configurations, such as registers, storage cells, storage transistors and the like, are well known in the art, wherein each type of storage structure may exhibit specific operational advantages and disadvantages.

For example, if a large amount of data is to be temporarily stored in an electronic device, such as a computer, a microprocessor and the like, frequent access to the data may be required. If an extremely high access speed is not of upmost priority, so-called "dynamic memories" may frequently be used, which may be efficiently implemented as integrated circuit areas requiring a single storage capacitor and one transistor for realizing a single bit of information. In this respect, a single bit of information is to be understood as any electronic mechanism that is capable of assuming two different electronic states, which in turn may be associated with two different logic states. Due to the fact that the charge in the respective storage capacitors has to be periodically refreshed, and due to the requirement of shifting a relatively high amount of charge upon programming a respective storage capacitor, the achievable latency is greater compared to so-called "static memory structures." In these static memory structures, a certain logic state may be determined by the conduction state of a circuit element, such as a transistor, and a change of the logic state is accomplished by changing the state of the circuit element, thereby achieving a latency that is basically determined by the switching time of the relevant circuit elements. Consequently, in this case, a change of a logic state of a static memory cell may be accomplished on the order of magnitude of the switching time of respective transistor elements of a technology node under consideration. Although the above-specified storage technique may represent a highly efficient mechanism that may be readily implemented in any type of integrated circuit, data storage is restricted to the times of supplying voltage to the device due to the volatile nature of this mechanism, since any information is lost upon switching off the supply voltage.

Since a permanent storage of logic states, in combination with the capability of their programmability, is frequently necessary, many non-volatile data storage techniques have been developed, wherein, in particular, many mass storage systems on the basis of magnetic storage devices, optical storage techniques and the like, may not be compatible with a plurality of applications due to the significant overhead in terms of hardware and software and, in particular, in terms of the moderately long access times. Therefore, significant efforts have been made in order to implement non-volatile storage mechanisms so as to complement or replace less time-efficient storage structures. For example, flash memories may be used as non-volatile storage structures, in which appropriately designed capacitive structures having the potential of being dynamically reconfigured are used in transistor configurations so as to specifically affect transistor characteristics, such as threshold voltage and the like.

A threshold voltage of a field effect transistor may be understood as device-specific voltage applied across at least a portion of a channel region so as to obtain a significant change of current drive capability of the channel region. For instance, the threshold voltage may represent a point where a further increase of the control voltage may result in a significant increase of the current flow through the channel region or a significant reduction of channel resistance when no or only a very low voltage may be applied between the respective terminals of the channel region, typically referred to as drain and source terminals or regions.

For example, in the above-identified storage mechanisms used in flash memories, charge carriers may be injected into or removed from a dielectric material in the vicinity of a transistor channel in order to control transistor characteristics on the basis of the charge carriers within the dielectric material. That is, the presence or absence of charge carriers injected into the dielectric material may have a significant influence on the channel region, for instance, in the form of a respective threshold voltage, thereby efficiently allowing detection of the difference in transistor characteristics when operating the transistor. Therefore, the specific state of the capacitive configuration, including the dielectric material with varying thread charge carriers, may reflect the desired logic state and may, therefore, be efficiently "read out." On the other hand, by changing the amount of charge carriers in the dielectric material, a desired logic state may be stored therein, which is typically accomplished by establishing specific operating conditions in order to inject or remove the thread charge carriers. In this manner, a single transistor may suffice for storing a single bit of information, thereby significantly contributing to superior information density of electronically programmable non-volatile storage devices. Although such storage transistors of flash memory structures, in which charges may be trapped or released from a specific portion of a gate electric structure of the transistor, may represent a very efficient solution for storing a single bit of information, it, nevertheless, turns out that, in particular, the ongoing scaling of advanced semiconductor devices may result in significant difficulties. For example, the further reduction of the overall gate dimensions of such storage transistors may require highly sophisticated techniques in forming the respective gate electrode structures. Therefore, implementation of such floating gate-type storage transistors may result in significant challenges, thereby necessitating additional efforts and adding complexity to the manufacturing processes.

Therefore, other approaches have recently been proposed in which the ferroelectric effect is exploited so as to provide circuit elements, such as resistors, transistors and the like, in which a ferroelectric material may be polarized in order to appropriately affect the operational behavior. The respective polarized state may then be considered as a respective logic state, which may, therefore, be written into or read out of a corresponding circuit element that includes the polarizable ferroelectric material. For example, in sophisticated ferroelectric transistors, the ferroelectric material may be incorporated into or near the dielectric material of the gate electrode structure, thereby significantly influencing the electronic characteristics of the channel region depending on the polarization state of the ferroelectric material.

With reference to FIGS. 1A-1D, a typical conventional ferroelectric prior art transistor may be described in more detail, wherein the transistor, as set forth above, may be used as a non-volatile storage transistor.

FIG. 1A schematically illustrates a cross-sectional view of a transistor 100, which may be provided in the form of an SOI (silicon-on-insulator or semiconductor-on-insulator) architecture in which a buried insulating layer, such as a silicon dioxide layer 102 separates the actual "active" semiconductor material 103, such as a silicon material, a silicon/germanium material and the like, from the semiconductor substrate material 101, provided in the form of silicon, germanium and the like. It should be appreciated that, in sophisticated applications, the active semiconductor layer 103 may be provided with a moderately reduced thickness of merely several nanometers, when a substantially depleted SOI configuration is to be provided. In other cases, any other appropriate thickness of the semiconductor layer 103 may be used, depending on the overall design requirements. Furthermore, in other cases, an SOI architecture may not be implemented and the semiconductor layer 103 may be formed above or as a part of the substrate material 101.

The transistor 100 may further comprise a gate electrode structure 110 that is positioned and configured so as to control a channel region 106 formed in the semiconductor layer 103 in order to provide a conductive channel, depending on the overall configuration of the transistor 100 and the voltage applied to the gate electrode structure 110 between a source region 104 and a drain region 105 formed in the semiconductor layer 103. It should be appreciated that the terms "source region" and "drain region" may be interchangeable depending on specific conditions under which the transistor 100 may be operated. Furthermore, any respective details with respect to the drain and source regions 104, 105 are not illustrated, for instance, with respect to dopant concentration and the like. As discussed above, in sophisticated applications, the drain and source regions 104, 105 in combination with the channel region 106 may represent a fully depleted transistor architecture, wherein the channel region 106 may remain substantially non-doped or may exhibit a very low dopant concentration, so that a corresponding depletion region may substantially occupy the entire channel region when applying a corresponding control voltage to the gate electrode structure 110.

Typically, the gate electrode structure 110 may comprise an electrode material of any appropriate configuration, for instance, based on semiconductor materials such as polysilicon, germanium and the like, possibly in combination with a metal-containing electrode material. For example, at any specific state of fabricating the gate electrode structure 110, a portion of a semiconductor material may be converted into a metal-semiconductor-compound, such as a metal silicide and the like, which is a well-established concept for enhancing overall conductivity of semiconductor-based regions. Moreover, in sophisticated applications, a corresponding metal-containing material, such as titanium nitride and the like, may be provided in combination with a semiconductor-based material. For convenience, merely electrode materials 111 and 112 are illustrated in FIG. 1A, while, however, any other configuration may be applied, as discussed above. Moreover, a dielectric material 113, a portion of which may be provided in the form of a ferroelectric material, may be provided so as to separate the conductive electrode material 111 from the channel region 106, as is well known for a typical field effect transistor architecture. It should be appreciated that sophisticated applications with reduced overall transistor dimensions and, in particular, with a reduced gate length, i.e., in FIG. 1A, the horizontal extension of the gate dielectric material 113, may require superior capacitive coupling between the gate electrode, i.e., the conductive material, such as the electrode material 111 contained therein, and the channel region 106, in order to allow sufficient and reliable control of the channel region 106. Therefore, frequently so-called "high-k" dielectric materials, i.e., dielectric materials having a dielectric constant of 10.0 or significantly higher, may be used, possibly in combination with "conventional" dielectric materials, such as silicon dioxide, silicon nitride, silicon oxynitride and the like. For example, dielectric materials on the basis of hafnium oxide may be frequently used in the context of high-k gate electrode structures, wherein, at the same time, hafnium oxide-based dielectric materials may also exhibit ferroelectric characteristics, thereby rendering these materials as viable candidates for being incorporated into a ferroelectric transistor element. It should be appreciated, however, that other ferroelectric materials may also be used for implementing a ferroelectric transistor. The final composition of the gate dielectric material 113 and the thickness thereof may be appropriately selected so as to comply with the overall device requirements. In particular, the position, thickness and composition of the dielectric material 113 are selected so as to provide the capability of establishing a desired polarization state, i.e., establishing a crystallographic configuration with the potential of having at least two different crystallographic states so as to form a permanent electric field that is aligned substantially perpendicular to a current flow direction in the channel region 106. The current flow direction in the channel region 106 may be substantially aligned to the horizontal direction of FIG. 1A.

Moreover, the gate electrode structure 110 may typically comprise a spacer structure 114 formed of any appropriate dielectric materials and having any appropriate dimension in the transistor length direction, i.e., the horizontal in FIG. 1A, so as to comply with the overall device requirements.

The transistor 100 as illustrated in FIG. 1A may be formed on the basis of well-established manufacturing techniques in which the semiconductor layer 103 may be formed by epitaxial growth techniques and the like, so as to have the desired overall configuration in terms of material composition, initial doping and the like. The buried insulating layer 102 may already be present or may be formed in accordance with well-established process techniques. Thereafter, a respective process sequence may be performed so as to deposit and/or otherwise form a dielectric base material, such as silicon dioxide, silicon oxynitride and the like, followed by the formation and treatment of other dielectric components, such as a hafnium oxide-based dielectric material, wherein a metal-containing material may also be typically provided in order to appropriately confine the underlying sensitive dielectric material. After the deposition of one or more further electrode materials, the patterning of the gate electrode structure 110 may be accomplished on the basis of sophisticated lithography and etch techniques, depending on the required overall transistor dimensions. The gate electrode structure 110 may further receive the spacer structure 114 and additional processes may be performed so as to provide the drain and source regions 104, 105 with appropriate electronic characteristics. For example, dopant species may be incorporated, for instance, by epitaxial growth technique, implantation and the like. Moreover, other appropriate processes may be performed, such as anneal processes and the like, in order to obtain the final electronic configuration of the transistor 100. Thereafter, further processes may be performed so as to provide encapsulation 107 for the base transistor structure and highly conductive contacts connecting to the drain and source regions 104, 105 and the gate electrode structure 110 and possibly to the semiconductor layer 103, if required.

FIG. 1B schematically illustrates the transistor 100 in a mode of operation in which a ferroelectric material formed in the vicinity of the dielectric material 113 has a first polarization state, indicated as 113A, in which, as discussed above, the crystallographic configuration may be established so as to obtain a specific electric field aligned substantially perpendicular to the current flow direction in the channel region 106. It may be assumed that the polarization state 113A may result in attraction of negative charge carriers, so that the channel region 106 may be enriched with negative charge carriers, such as electrons, thereby significantly affecting the electronic behavior of the transistor 100. For example, when assuming a substantially N-type configuration, the polarization state 113A may result in reduced overall channel resistance or an earlier inset of a current flow for a given voltage applied to the gate electrode structure 110. That is, for N-type transistors, application of a reduced gate voltage would be necessary so as to obtain a desired current flow through the channel region 106 when the polarization state 113A is effective.

That is, the polarization state 113A may be established in the material 113 by applying an appropriate programming voltage between a terminal 110T of the gate electrode structure 110 and a "ground" terminal 103T connecting to the semiconductor material 103. It should be appreciated that FIG. 1B is only a schematic illustration of the programming mechanism, assuming a bulk configuration in which the ground terminal 103T may be required for obtaining a desired electric field across the channel region 106. In other cases, when using a fully depleted device configuration, as also discussed above, the drain and/or source regions 105, 104 may be connected to an appropriate reference voltage, such as ground potential, by means of respective terminals 105T, 104T, thereby also establishing a respective desired electric field across the channel region 106.

FIG. 1C schematically illustrates the transistor 100 in which a second polarization state 113B that is opposite to the polarization state 113A has been established, for instance, by applying an electric field of reversed polarity to the dielectric material 113 by means of an appropriate voltage at the terminals 110T, 103T and/or the terminals 105T, 104T, as discussed above. In this case, positive charge carriers may be attracted into the channel region 106, for instance by removing electrons, thereby contributing to increased channel resistance for a given gate voltage for an N-type transistor. That is, the formation of a conductive channel in the channel region 106 for a given gate voltage may be significantly suppressed compared to the situation described with reference to FIG. 1B. Consequently, the formation of a conductive channel in the channel region 106 may be enabled only at a significantly higher gate voltage compared to the situation of FIG. 1B. That is, the threshold voltages for the transistor 100 having two different polarization states, i.e., the states 113A, 113B, may significantly differ from each other, and this difference may be reliably used for detecting the different threshold voltages on the basis of, for instance, the different current drive capabilities. It should be appreciated that, during "normal" operation of the transistor, significantly reduced gate voltages may be used for controlling the channel region 106 compared to the programming voltage, which may result in alignment of the crystallographic configuration to the externally applied programming electric field. For instance, the programming voltage may be on the order of magnitude of 5 V, while the standard operating voltage may be approximately 1 V or even less.

FIG. 1D schematically illustrates the different behavior of the device 100 having the different electronic configurations of FIGS. 1B and 1C. FIG. 1D illustrates the source/drain current flow for the different gate voltages, wherein the gate voltage is plotted along the horizontal axis, while the current is plotted along the vertical axis. As is evident from FIG. 1D and as discussed above, for the N-type configuration, a significant increase of the source/drain current may be observed for the polarization state 113A at a low gate voltage, resulting in curve A. On the other hand, for the same gate voltage, the polarization state 113B may result in essentially no current flow and therefore a significantly higher gate voltage may be required so as to finally induce significant increase of source/drain current. Consequently, the gate voltage causing the significant increase of current flow may be referred to as a respective threshold voltage, thereby indicating that the polarization state 113A results in a low threshold voltage, while the polarization state 113B results in a high threshold voltage for an N-type transistor configuration. It should be appreciated that a corresponding functional behavior may also be obtained for P-type ferroelectric transistors, wherein, however, any relevant polarities and polarizations are reversed. In this case, however, a significant difference in the resulting threshold voltages may also be obtained and may be used as a storage mechanism. It should be appreciated that once a specific polarization state is established, this state may prevail, even after shutting down the supply voltage, thereby providing a non-volatile storage mechanism. On the other hand, by applying a respective programming voltage, the polarization state may be adjusted in accordance with the desired logic state to be implemented in the transistor 100 at any time during the operation of the transistor 100.

It turns out, as discussed above, that although a plurality of promising approaches for non-volatile programmable storage mechanisms are available, wherein, in particular, the ferroelectric transistor concept may be highly compatible with sophisticated overall manufacturing techniques, there is still a demand for increasing the overall bit density and/or providing superior operating conditions and flexibility in providing non-volatile storage mechanisms. For instance, it has been suggested to double the bit density of flash storage transistors by appropriately controlling the injection and removal of charge carriers into the floating gate of the transistors so as to differently manipulate the trapped charges at respective ends of the floating gate dielectric material. That is, at one end of the floating gate along the transistor length direction, a specific control regime may be applied so as to allow the injection or removal of the charge carriers in this area, while at the opposite end of the floating gate, charge carriers may be injected or removed independently from the other end, thereby providing the possibility of storing two bits independently within a single transistor. For reading-out the two different bits, for instance, the current flow in the two opposite directions, may be observed and the corresponding current values and directions may be associated with respective logic states.

Although this concept of independent charge carrier trapping and removal at different areas of the floating gate configuration may provide increased overall bit density, it, nevertheless, turns out that significant additional efforts are required in order to implement the dual bit configuration, while the merely moderate compatibility with sophisticated device techniques still have to be taken into account, as is also discussed above with reference to single bit flash transistors.

In view of the situation described above, the present disclosure, therefore, relates to techniques in which non-volatile storage elements, such as field effect transistors, may be provided, at least partially, on the basis of a ferroelectric material, while avoiding or at least reducing the effects of one or more of the problems identified above.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Basically, it has been recognized that, in SOI architectures, the highly efficient storage mechanism on the basis of a ferroelectric material may be implemented in the buried insulating layer of the SOI configuration, thereby contributing to the superior flexibility in designing respective SOI storage transistors. For example, the superior flexibility associated with the implementation of the storage mechanism into the buried insulating layer may result in less critical process techniques for forming sophisticated gate electrode structures of reduced dimensions, thereby potentially contributing to superior operational behavior due to a substantially non-changed overall electrode configuration, while still providing a non-volatile storage mechanism. In other illustrative embodiments, the storage mechanism implemented on the basis of a buried insulating layer may be efficiently combined with a further non-volatile storage mechanism, so that, in total, an increased bit density may be obtained. In some illustrative embodiments, the storage mechanism based on the buried insulating layer may be combined with a storage mechanism implemented in the gate electrode structure based on a ferroelectric material provided therein, while, in other illustrative embodiments, well-established floating gate configurations may be supplemented by the ferroelectric material based storage mechanism in the buried insulating layer, thereby also enhancing overall efficiently of these conventional floating gate approaches.

One illustrative embodiment disclosed herein relates to a non-volatile storage element. The storage element includes a channel region formed in a semiconductor material and a control electrode structure positioned to control a current flow through the channel region. The non-volatile storage element further includes a first storage mechanism positioned to adjust a value of a threshold voltage of the channel region. Furthermore, a second storage mechanism is positioned to adjust the value of the threshold voltage, wherein the second storage mechanism comprises a ferroelectric material and is configured to enable, in combination with the first storage mechanism, selection of more than two distinct values of the threshold voltage of the channel region.

According to a further illustrative embodiment disclosed herein, a non-volatile storage transistor element includes a channel region and a gate electrode structure positioned to control a current flow in the channel region. The non-volatile storage transistor element further includes a buried insulating layer formed below the channel region, wherein the buried insulating layer comprises a ferroelectric material so as to provide a storage mechanism for storing information in a non-volatile manner.

In a further illustrative embodiment disclosed herein, a method is provided. The method includes selecting a first polarization state of a ferroelectric material formed near a channel region of a transistor element. Moreover, the method includes selecting a first storage state of at least one of a charge-trapping material and a second ferroelectric material formed near the channel region. Moreover, the method includes assigning a first logic state to a first channel condition induced by the first polarization state and the first storage state. Additionally, the method includes selecting a second storage state of the at least one of a charge-trapping material and a second ferroelectric material. Moreover, a second logic state is assigned to a second channel condition induced by the first polarization state and the second storage state. Additionally, the method includes assigning at least one further logic state to one of the first and second storage states, when combined with a second polarization state of the ferroelectric material, wherein the first and second polarization states are inverse to each other.

BRIEF DESCRIPTION OF THE DRAWINGS

The disclosure may be understood by reference to the following description taken in conjunction with the accompanying drawings, in which like reference numerals identify like elements, and in which:

FIG. 1A schematically illustrates a cross-sectional view of a conventional prior art ferroelectric transistor element;

FIGS. 1B and 1C schematically illustrate cross-sectional views of the conventional prior art ferroelectric transistor element in two different polarization states;

FIG. 1D schematically illustrates the different drive current capabilities and, thus, threshold voltages of the prior art ferroelectric transistor element corresponding to the different polarization states of FIGS. 1B and 1C;

FIG. 2 schematically illustrates a cross-sectional view of a storage transistor element comprising at least one storage mechanism on the basis of ferroelectric material provided in a buried insulating layer according to illustrative embodiments of the present disclosure;

FIGS. 3A-3D schematically illustrate cross-sectional views of a storage transistor element including two storage mechanisms, at least one of which is based on ferroelectric material provided in the buried insulating layer, according to further illustrative embodiments of the present disclosure; and FIG. 3E schematically illustrates a diagram of different electronic states, for instance, different threshold voltage values that correspond to different electronic configurations of the storage transistor elements shown in FIGS. 3A-3D.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure is based on the concept that improvements with respect to information density and/or design flexibility may be achieved for a non-volatile storage element, such as a transistor element, by taking advantage of the overall configuration of an SOI architecture in transistor elements, wherein a buried insulating material may be replaced, partially or completely, by a ferroelectric material in order to provide a mechanism for storing, in a non-volatile manner, information that may be read out during operation of the transistor element. That is, while basically preserving the SOI architecture, an additional non-volatile control and, thus, storage mechanism, may be provided which may, in principle, enable the formation of well-established gate electrode structures without significant changes compared to conventional transistors, thereby providing an additional degree of design flexibility, since the configuration of the respective gate electrode structure may be selected in accordance with design criteria other than criteria to be taken into account when designing sophisticated transistor elements. In some illustrative embodiments disclosed herein, the additional design flexibility may be advantageously used so as to provide a non-volatile storage element that provides increased bit density by providing an additional storage mechanism, for instance, formed in a respective gate electrode structure. That is, in some illustrative embodiments, the additional storage mechanism may be provided in the gate electrode structure in order to appropriately affect the channel region, which may, thus, be sandwiched between the ferroelectric material provided in the buried insulating layer and the storage mechanism provided in the gate electrode structure. In providing the additional storage mechanism in or near the gate electrode structure, in some illustrative embodiments, the storage mechanism may be implemented on the basis of a ferroelectric material. In this manner, highly efficient manufacturing techniques as are available for sophisticated transistor elements may be applied to the gate electrode structure as, for instance, described with reference to FIGS. 1A-1D, while, at the same time, the storage mechanism provided on the basis of the ferroelectric material in the buried insulating layer may result in a higher number of distinct electronic configurations, which may be assigned to respective logic states. Consequently, the two individually controllable storage mechanisms may provide increased bit density, for instance, at least two distinct bits may be "stored" in the respective storage transistor element, while, on the other hand, overall transistor dimensions and the basic transistor configuration may not require significant modifications.

In other illustrative embodiments, the storage mechanism associated with the gate electrode structure may be provided on the basis of a charge trapping layer, i.e., on the basis of a floating gate-type gate structure, while the further storage mechanism in the buried insulating layer on the basis of the ferroelectric material may additionally provide further distinct electronic and, thus, logic states, of the transistor. For example, as discussed above, well-established floating gate-type transistors may receive the storage mechanism based on the ferroelectric material incorporated in the buried insulating layer, thereby possibly doubling the information density provided by the mechanism based on the charge-trapping layer. As discussed above, the gate electrode structure including the charge-trapping layer may provide a single bit of information or, in other cases, a dual bit configuration may be provided. By combining this mechanism with the buried ferroelectric material, a respective multiplication of the bit density may be achieved.

In some illustrative embodiments, the storage mechanism based on the buried ferroelectric material and the storage mechanism implemented in or in the vicinity of the gate electrode structure based on a ferroelectric material may provide for different "strength" or "efficiency" of the associated control mechanism for the current flow in the channel region, for instance, due to different composition of the ferroelectric material, a different area occupied by the respective ferroelectric material and the like. Due to this mechanism, the total control effect of the two ferroelectric material-based storage mechanisms may be efficiently adjusted in order to obtain sufficiently distinct drive current behaviors in the channel region. For instance, the area of the ferroelectric material positioned in the buried insulating material and being in contact with or near the channel region may have an increased influence due to the fact that the ferroelectric material may also be positioned so as to be in contact with, at least partially, or positioned near the drain and source regions of the transistor. In other cases, the effective distance of the ferroelectric material within the buried insulating layer and within the gate electrode structure may be adjusted differently so as to provide an additional control mechanism for fine tuning the total response of the channel region to the respective ferroelectric materials in the gate electrode structure and the buried insulating layer, respectively.

Consequently, for an otherwise given overall transistor configuration, respective transistor characteristics, such as threshold voltage and/or current drive capability and the like, may be assigned to a respective number of logic states when the ferroelectric material in the buried insulating layer is in a first polarization state. Similarly, the respective transistor states may be assigned to respective logic states when the ferroelectric material in the buried insulating layer is in a second polarization state, as long as the resulting transistor states are sufficiently distinguishable from each other so as to allow a reliable detection of the various transistor states and, thus, logic states, during normal operation of the storage transistor element. For example, when two storage mechanisms may be provided, each having two different electronic and, thus, logic states, the combined effect of the individually controlled storage mechanisms may result in four different transistor states and, thus, logic states, which, upon appropriately configuring the overall transistor configuration, may be sufficiently distinguishable from each other so as to provide two bits of information within the device area that corresponds to a single transistor element. In this manner, the bit density may be doubled without undue modification of the overall transistor configuration.

With reference to FIGS. 2 and 3A-3E, further illustrative embodiments will now be described in more detail, wherein reference may also be made to FIGS. 1A-1D, if appropriate.

FIG. 2 schematically illustrates a cross-sectional view of a non-volatile storage element, in some illustrative embodiments provided as a transistor element, 200, which may comprise a channel region 206 formed in an appropriate semiconductor layer 203 and laterally enclosed by appropriately doped semiconductor regions 204, 205, which may also be referred to herein as source region and drain region, respectively. In this case and as discussed above, the terms "source region" and "drain region" may also be interchangeable depending on the overall circuit configuration in which the element 200 may be used. Regarding the semiconductor material 203 for forming therein the drain and source regions 205, 204 and the channel region 206, basically any appropriate materials and dopant distributions may be used so as to comply with the overall device requirements. For example, as previously discussed, in sophisticated applications, the initial layer thickness of the semiconductor layer 203 may range between approximately 10 nm and 3 nm, depending on design requirements. Moreover, the semiconductor layer 203 may comprise any appropriate material, such as silicon, silicon/germanium, silicon/carbon, III-V semiconductor compounds and the like. For convenience, a specific dopant profile of the drain and source regions 205, 204 is not illustrated.

Furthermore, a so-called "raised drain and source configuration" may frequently be applied, wherein additional semiconductor material (not illustrated) may be formed in or on the initial material of the semiconductor layer 203 in order to provide appropriate contact regions having the desired high dopant concentration. Any such raised drain and source regions may be formed on the basis of epitaxial growth techniques and the like. Furthermore, in order to control conductivity and current flow within the channel region 206 along the current flow direction, i.e., in FIG. 2, the horizontal direction, a gate electrode structure 210 may be provided with appropriate dimensions and composition so as to have an appropriate capacitive coupling to the channel region 206 in order to appropriately control the current flow therein. In some illustrative embodiments, the gate electrode structure 210 may represent a sophisticated gate electrode structure, possibly including a high-k dielectric material, generally in combination with a metal-containing electrode material provided in the vicinity of the high-k dielectric material in order to provide appropriate conditions at and within the channel region 206. That is, in these illustrative embodiments, the gate electrode structure 210 may substantially represent a "conventional" sophisticated gate electrode structure mainly designed for achieving proper transistor operation, while the desired non-volatile storage mechanism may be implemented in a buried insulating layer 202 formed below the channel region 206 and above a substrate material 201, as will be discussed later on in more detail.

In the case of a standard gate electrode structure that does not require an additional storage mechanism, the gate electrode structure 210 may comprise a dielectric material 213, for instance, formed on the basis of conventional dielectric materials, such as silicon oxide, silicon nitride, silicon oxynitride and the like, possibly in combination with any type of high-k dielectric material, wherein the type of high-k dielectric material may be selected in accordance with device requirements that are not related to providing a ferroelectric storage mechanism. Moreover, in such cases, a specific cap layer 212, such as titanium nitride and the like, may be provided in combination with an additional semiconductor-based electrode material 211, which may be partially replaced by a further highly conductive metal-containing material, as also discussed above in the context of FIG. 1A. Furthermore, a spacer structure 214 may be typically provided so as to appropriately encapsulate sensitive materials of the gate electrode structure 210 and provide a mask for profiling the dopant concentration in the drain and source regions 205, 204, if required.

Furthermore, the element 200 may comprise the buried insulating material 202, which may comprise a ferroelectric material 202F having any appropriate crystallographic configuration and thickness required for appropriately influencing the channel region 206 upon establishing a respective polarization state in the ferroelectric material 202F. For example, the buried insulating layer 202 may have an overall thickness of approximately 10-50 nm and even higher, wherein, at least within the area of the element 200, which may be laterally delineated by appropriate isolation structures 207, such as shallow trench isolations, certain portions may be formed of or may include the ferroelectric material 202F. In some illustrative embodiments, the buried insulating layer 202 may comprise conventional dielectric materials, such as silicon dioxide, silicon nitride, silicon oxynitride, which may be appropriately positioned so as to sandwich the ferroelectric material 202F, thereby providing superior interface characteristics with respect to the channel region 206 and/or the substrate material 201. For instance, a conventional dielectric material 202A may be formed below the ferroelectric material 202F, thereby forming a substantially inert interface with the substrate material 201. Similarly, in some illustrative embodiments, a conventional dielectric material 202B may be formed on the ferroelectric material 202F, thereby also providing superior interface characteristics with the adjacent channel region 206 and the drain and source regions 205, 204. In other cases, interface characteristics as obtained by a substantially direct contact between the ferroelectric material 202F and the regions in the semiconductor layer 203 and/or the substrate material 201 may be acceptable and, therefore, one or both of the interface dielectric materials 202A, 202B may be omitted. In some illustrative embodiments, the ferroelectric material 202F may be provided on the basis of hafnium oxide material, which is a well-established dielectric material that may also be used as the high-k dielectric material in sophisticated gate electrode structures. Hence, appropriate techniques for depositing, patterning and treating the ferroelectric material 202F so as to establish the desired crystallographic configuration are well established and may be used in forming the ferroelectric material 202F. It should be appreciated that the ferroelectric material 202F may be formed such that respective polarization states may have a direction that is substantially perpendicular to the current flow direction in the channel region 206, thereby providing high efficiency in controlling the conductivity state or current flow in the channel region 206 upon establishing a desired polarization state in the ferroelectric material 202F. In other illustrative embodiments, in addition or alternatively to hafnium oxide based materials, other ferroelectric materials may be used.

The element 200 may be formed in accordance with well-established process techniques on the basis of well-established materials when providing the semiconductor material 203 and forming the gate electrode structure 210 and the drain and source regions 205, 204, wherein, as discussed above, design criteria in particular may be respected as may be required for forming other sophisticated transistor elements in combination with the element 200. Prior to forming the gate electrode structure 210, the ferroelectric material 202F may be incorporated into the buried insulating material 202, which may be accomplished prior to the formation of the isolation structure 207 or after the formation thereof, while, in other cases, some process steps may be performed prior to the formation of the structures 207, while other process steps may be performed after completing the isolation structure 207. For example, when starting from a substantially bulk-type substrate configuration, the buried insulating material 202 may be formed, for instance, by forming the layer 202A, for instance, based on oxidation, deposition and the like, followed by the deposition of the base material for the ferroelectric material 202F. The deposition may be performed on the basis of well-established deposition techniques, as are also typically used for forming sophisticated high-k dielectric layers for gate electrode structures. For example, chemical vapor deposition, physical vapor deposition, atomic layer deposition and the like may be applied. Thereafter, the layer 202B, if required, may be formed, for instance, by deposition, followed by epitaxial growth techniques, wherein laterally provided seed material may be used for growing the semiconductor material 203, which may be subsequently planarized and thinned to an appropriate thickness on the basis of well-established glamorization techniques.

In other illustrative embodiments, a portion of the buried insulating material 202 may be removed, for instance, by selective etch techniques, which may be accomplished by forming respective trenches for the isolation structures 207 and introducing a highly selective etch chemistry so as to selectively remove the material of the buried insulating layer 202. Thereafter, the ferroelectric material 202F may be deposited into the respective openings of the isolation structures 207 so as to also be deposited, at least partially, within any cavities previously formed by the selective etch process. In still other cases, a plurality of openings (not shown) may be formed in the initial semiconductor material 203, such as a plurality of trenches, in which the basic buried insulating material 202 may be removed and replaced by the ferroelectric material 202F, possibly in combination with the conventional dielectric materials 202A and/or 202B. In this case, the ferroelectric material 202F may not be continuously provided below the channel region 206 and the drain and source regions 205, 204, but rather, respective islands may be provided, which, however, may be sufficient to appropriately enable control of the channel region 206.

In still other illustrative embodiments, the substrate material 201 may be provided as a carrier substrate and the buried insulating layer 202 may be formed by oxidation, deposition and the like, but also, at least in certain areas, the ferroelectric material 202F may be formed on the basis of any well-established process strategies. Thereafter, the initial semiconductor layer 203 may be formed, for instance, by applying wafer bonding techniques. In this case, providing the dielectric material 202B, for instance, in the form of a silicon dioxide layer may provide substantially similar surface conditions as in conventional wafer bonding techniques for forming a desired silicon-based semiconductor material on a silicon oxide-based dielectric material.

Hence, after providing the ferroelectric material 202F in the buried insulating layer 202, the further processing may continue, as discussed above, so as to form the rest of the element 200.

When operating the element 200, a desired gate voltage may be applied, as schematically indicated by 210V, in order to control the current flow in the channel region 206, as is also typically the case in conventional transistor elements. Furthermore, additional control may be obtained by applying a respective voltage across the buried insulating material 202, as schematically indicated by 201V, thereby obtaining, if desired, superior control of the channel region 206. It should be appreciated that, during normal operation, the voltages 210V and 201V may be selected within a range that is significantly outside any voltage range as required for establishing a specific polarization state in the ferroelectric material 202F, as also discussed above in the context of FIGS. 1A and 1B. For example, the voltages for controlling the channel region 206 for the normal operation of the element 200 may be in the range of approximately 2 V and significantly less, such as approximately 1 V, while the voltage 201V for establishing the desired polarization state in the material 202F may be in the range of several volts, such as approximately 5 V. It should be appreciated that, upon "programming" the element 200, i.e., establishing a desired polarization state in the ferroelectric material 202F, the polarity of the voltage 201V may be changed, depending on the required polarization state. Consequently, programming of the element 200 may be accomplished by selecting a sufficiently high voltage 201V with appropriate polarity, while afterwards the normal operation may be obtained on the basis of the voltage 210V in the range of the normal supply voltage and possibly on the basis of the voltage 201V that is significantly lower compared to the programming voltage.

In a further illustrative embodiment, the gate electrode structure 210 may be configured so as to implement an additional storage mechanism, that is, additional to the storage mechanism provided by the ferroelectric material 202F in combination with a configuration for applying the voltage 201V with a magnitude that is sufficient to program the ferroelectric material 202F, i.e., to establish a specific polarization state, as discussed above. The storage mechanism in the context of the gate electrode structure 210 may be implemented in one illustrative embodiment on the basis of further ferroelectric material, that is, the dielectric layer 213 may have incorporated therein a ferroelectric material, such as a hafnium oxide-based ferroelectric material, as is also discussed above in the context of FIG. 1A. Consequently, the dielectric layer 213 including the ferroelectric material in combination with the control voltage 210V may be applicable so as to correspond to a programming voltage for the dielectric layer 213 including the ferroelectric material, thereby providing a further storage mechanism. Consequently, the ferroelectric material in the layer 213 and the ferroelectric material 202F in the buried insulating layer 202 may be independently polarized, i.e., programmed, thereby providing a superimposed electric field within the channel region 206, which may result in a corresponding different channel conductivity or drive current, for instance, as expressed by a respective difference in threshold voltage values, thereby providing the possibility of establishing more than two different channel states and, thus, logic states.

It should be appreciated that the dielectric layer 213 including the ferroelectric material may be formed in accordance with well-established process techniques, as are also discussed above with reference to the transistor element 100 of FIG. 1A.

In still other illustrative embodiments, the gate electrode structure may comprise an additional storage mechanism formed on the basis of a floating gate configuration, in which at least a portion of the dielectric layer 213 may comprise a layer or area for trapping charge carriers, which may be injected into or removed from the charge carrier trapping area by applying an appropriate programming voltage or erase voltage, as is well known for floating gate-type transistors. Consequently, also in this case, the dielectric layer 213 may represent, in combination with a respective capability of applying the voltage 210V with sufficient height, a further storage mechanism so as to provide more than two different transistor states and, thus, logic states in combination with the ferroelectric material 202F.

It should be appreciated that the floating gate-type electrode structure may be formed on the basis of well-established process strategies, for instance, providing an appropriate dielectric layer stack, such as oxide-nitride-oxide and the like, in which one of these layers, typically the middle layer, may act as a charge-trapping layer. In other cases, the storage mechanism provided by the dielectric material 213, including a charge-trapping layer, may have a configuration which, itself, may provide two or more different transistor states and, thus, logic states, wherein at least some of these states may be appropriately modified by a corresponding polarization state of the ferroelectric material 202F, thereby providing an even further increased number of distinct transistor states. For example, as discussed above, sophisticated flash transistor techniques may include a gate electrode structure and a corresponding regime for applying appropriate gate voltages so as to establish two bits of information, wherein this information density may be increased by appropriately adjusting and, thus, selecting the polarization states of the ferroelectric material 202F.

FIGS. 3A-3D schematically illustrate cross-sectional views of a storage element, such as a field effect transistor, including two independent storage mechanisms so as to implement more than one bit of information.

FIG. 3A schematically illustrates a cross-sectional view of an element 300, which may represent a storage transistor having a gate electrode structure 310 and a buried ferroelectric material 302F, which may sandwich a corresponding channel region 306, the conductivity state or drive current capability of which is to be controlled by respective storage mechanisms. In one illustrative embodiment, the gate electrode structure 310 may comprise a storage mechanism 300A, which may be based on a ferroelectric material 311F provided in the gate electrode structure 310. Furthermore, a second storage mechanism 300B formed on the basis of a ferroelectric material 302F may be provided as an independent mechanism for establishing more than one information bit in the element 300. It should be appreciated that the element 300 is illustrated in a very schematic manner and may have a configuration as previously described in the context of the element 200 of FIG. 2, when referring to a configuration including at least two independent storage mechanisms. In the embodiment illustrated in FIG. 3A, both storage mechanisms may be based on ferroelectric materials, such as the ferroelectric material 311F and the buried ferroelectric material 302F. In other illustrative embodiments (not shown), the first storage mechanism 300A may be implemented on the basis of a charge carrier-trapping material, as also discussed above with reference to FIG. 2.

Consequently, the ferroelectric material 311F may have an appropriate configuration so as to enable the establishment of two different, i.e., opposite, polarization states, the direction of which may basically be perpendicular to the current flow direction in the channel region 306. The current flow direction, as also discussed above in the context of FIGS. 1A and 2, may represent the horizontal direction in FIG. 3A. The basic concept of establishing a desired polarization state may be the same as already discussed with reference to the elements 100 and 200. Consequently, the storage mechanism 300A may have a first polarization state 313A, obtained by appropriately programming the ferroelectric material 311F, as discussed above, and the storage mechanism 300B may have a first polarization state, indicated as 302A, which may also be established on the basis of strategies as discussed above with reference to FIG. 2. In the case shown in FIG. 3A, both polarization states 313A, 302A may point in the same direction, thereby providing a specific conductivity state or current drive capability, as also discussed above.

FIG. 3B schematically illustrates the element 300, in which the polarization state 302A of the mechanism 300B is preserved, while the polarization state of the mechanism 300A is reversed, as indicated by 313B. Consequently, the polarization states 313B and 302A may partially compensate each other, thereby resulting in a corresponding conductivity state that differs from that of the combined polarization in FIG. 3A.

FIG. 3C schematically illustrates the element 300 in which the polarization state of the mechanism 300B is reversed, as indicated by 302B, and, therefore, the two polarization states have the same direction, thereby increasing the electric field in the channel region 306.

FIG. 3D schematically illustrates the element 300 wherein the polarization state 300B, relative to the polarization in FIG. 3C, is preserved, while the mechanism 300A may have been programmed into the polarization state 313A that is reverse to the states as shown in FIGS. 3B and 3C and which may, therefore, correspond to the state as shown in FIG. 3A. In this case, the combination of the respective polarizations may also be different in the channel region 306 compared to the combined polarization effects of the element 300 as shown in FIGS. 3A-3C.

It should be appreciated that, as already discussed above, in illustrative embodiments, the respective "efficiency" or "strength" of the polarization states 313A, 313B on the one hand, and 302A, 302B on the other hand may be different, so that the respective "mixed" states as shown in FIGS. 3B and 3D may both have a different final effect on the channel region 306. For instance, it may be assumed that basically the polarization states 313A, 313B may be less efficient in influencing the channel region 306, due to a reduced overall area covered by the respective ferroelectric material 311F compared to the buried ferroelectric material 302F. In other cases, the corresponding efficiency or strength of the respective polarization may be adjusted on the basis of other parameters, such as effective distance of the respective ferroelectric material to the channel region 306, which may be accomplished by selecting an appropriate thickness of any interface materials, such as the materials 202A, 202B as shown in FIG. 2, and/or by any conventional dielectric materials, which may be provided in combination with the ferroelectric material in the gate electrode structures 310, as is also discussed in the context of FIG. 1A and FIG. 2.

Consequently, a plurality of mechanisms may be available so as to adjust the efficiency or strength of the respective ferroelectric materials in order to enable a sufficient difference between the mixed states shown in FIGS. 3B and 3D.

FIG. 3E schematically illustrates a graph indicating the current flow behavior corresponding to the four different states represented by FIGS. 3A-3D. That is, curve AA corresponds to the configuration shown in FIG. 3A, wherein both storage mechanisms 300A, 300B have the "downward" polarization states 313A, 302A. Consequently, for an N-type configuration of the element 300, the minimum threshold voltage may be achieved, since, in this case, the resistance of the channel region 306 is lowest.

Curve BB may correspond to the configuration of the element 300 as illustrated in FIG. 3C. That is, in this configuration, both polarization states may correspond to the "upward" direction and, thus, the combined effect on the channel region 306 may result in the highest threshold voltage value, since, in this case, i.e., for an N-type configuration, positive charge carriers may be preferably accumulated in the channel region 306, thereby contributing to the highest channel resistance.

Curve AB corresponds to the configuration shown in FIG. 3D, wherein it is evident that the effect of the polarization state 302B may be partially compensated by the effect of the polarization state 313A. Due to the different efficiency or strength of these polarization states as discussed above, however, the shift towards a reduced threshold voltage value, i.e., in FIG. 3E, a shift towards the left hand side, is less pronounced compared to a rightward shift of curve BA, which corresponds to the configuration shown in FIG. 3B. That is, the polarization state 313B counteracts the polarization state 302A. Due to the different strengths, however, the finally obtained threshold voltage value is still distinguishable from the threshold voltage value of curve AB. Consequently, the mixed states represented by FIGS. 3B and 3D may be readily distinguished from each other, while the "pure" states represented by FIGS. 3A and 3D may represent the available maximum and minimum threshold voltage values.

Consequently, by providing appropriate peripheral components for establishing the voltages 210V and 201V (see FIG. 2), the storage mechanisms 300A, 300B may be programmed independently from each other, thereby providing different combinations of the overall polarization that is effective within the channel region 306. Upon appropriately selecting the individual efficiency or strength of the polarization states, any mixed states may also be sufficiently different from each other, thereby obtaining four distinct states of the functional behavior of the element 300, for instance, represented by four different threshold voltage values. Consequently, upon operating the element 300 on the basis of a normal operating voltage, the corresponding current drive capability may be readily identified and may be associated with a respective logic state. That is, the polarization state 313A may be associated with logic states corresponding to the threshold voltage values represented by curves AA, AB for different polarization states of the buried ferroelectric material 302F. Similarly, the polarization state 313B of the material 311F may be assigned to respective logic states corresponding to the threshold voltage values represented by curves BA, BB for different polarization states of the material 302F.

It should be appreciated that the above considerations are equivalently applicable to a P-type configuration of the element 300. For example, a P-type ferroelectric transistor may be obtained by appropriately inverting any dopings used, while the respective polarization directions may also have an inverse effect on the respective threshold voltages compared to the situation as illustrated in FIG. 3E.

As a result, the present disclosure provides storage elements, such as storage transistors, in which at least one storage mechanism may be provided on the basis of a buried ferroelectric material, for instance, by incorporating a ferroelectric material in the buried insulating layer of an SOI transistor architecture. In this manner, overall design flexibility may be enhanced. Furthermore, in illustrative embodiments, at least one further storage mechanism may be provided, for instance, on the basis of a charge-trapping layer, as is typically used in floating gate-type storage transistors, while, in other illustrative embodiments, a further ferroelectric material may be provided within the gate electrode structure, thereby contributing to increased information density, while still preserving a high degree of compatibility with modern sophisticated high-k metal gate electrode structures used in sophisticated fully depleted SOI transistors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A non-volatile storage element, comprising:
    a channel region formed in a semiconductor material;
    a control electrode structure positioned to control a current flow through said channel region;
    a first storage mechanism positioned to adjust a value of a threshold voltage of said channel region; and
    a second storage mechanism positioned to adjust said value of said threshold voltage, said second storage mechanism comprising a ferroelectric material and being configured to enable, in combination with said first storage mechanism, selection of more than two distinct values of said threshold voltage of said channel region.

2. The non-volatile storage element of claim 1, wherein said first storage mechanism and said ferroelectric material of said second storage mechanism are positioned so as to sandwich said channel region in a direction that is substantially perpendicular with respect to a current flow direction of said channel region.

3. The non-volatile storage element of claim 1, wherein said ferroelectric material of said second storage mechanism is provided in a buried insulating layer formed in contact with said channel region.

4. The non-volatile storage element of claim 1, wherein said first storage mechanism comprises a further ferroelectric material.

5. The non-volatile storage element of claim 1, wherein said first storage mechanism comprises a charge trapping layer.

6. The non-volatile storage element of claim 1, wherein said ferroelectric material of said second storage mechanism is formed in said control electrode structure.

7. The non-volatile storage element of claim 1, wherein said first storage mechanism has a first efficiency for adjusting the value of said threshold voltage and said second storage mechanism has a second efficiency for adjusting the value of said threshold voltage and wherein said first efficiency differs from said second efficiency.

8. The non-volatile storage element of claim 1, wherein said first storage mechanism is implemented in said control electrode structure.

9. The non-volatile storage element of claim 1, further comprising a drain region and a source region connected to said channel region so as to form a transistor configuration formed on the basis of a buried insulating layer.

10. A non-volatile storage transistor element, comprising:
    a channel region;
    a gate electrode structure positioned to control current flow in said channel region; and
    a buried insulating layer formed below said channel region, said buried insulating layer comprising a ferroelectric material so as to provide a storage mechanism for storing information in a non-volatile manner.

11. The non-volatile storage transistor element of claim 10, wherein said gate electrode structure comprises a further storage mechanism that, in combination with said storage mechanism, provides more than two non-volatile logic states.

12. The non-volatile storage transistor element of claim 10, wherein said gate electrode structure comprises a ferroelectric material as a component of said further storage mechanism.

13. The non-volatile storage transistor element of claim 10, wherein said gate electrode structure comprises at least one of a ferroelectric material and a charge trapping material as a component of said further storage mechanism.

14. The non-volatile storage transistor element of claim 11, wherein said storage mechanism has a first efficiency for adjusting a value of a threshold voltage of said channel region and said further storage mechanism has a second efficiency for adjusting the value of said threshold voltage and wherein said first efficiency differs from said second efficiency.

15. The non-volatile storage transistor element of claim 10, further comprising an electrode material formed below said buried insulating layer for applying an electric field in said ferroelectric material.

16. A method, comprising:
    selecting a first polarization state of a ferroelectric material formed near a channel region of a transistor element;
    selecting a first storage state of at least one of a charge trapping material and a second ferroelectric material formed near said channel region;
    assigning a first logic state to a first channel condition induced by said first polarization state and said first storage state;
    selecting a second storage state of said at least one of a charge trapping material and a second ferroelectric material;
    assigning a second logic state to a second channel condition induced by said first polarization state and said second storage state; and
    assigning at least one further logic state to one of said first and second storage states when combined with a second polarization state of said ferroelectric material, said first and second polarization states being inverse to each other.

17. The method of claim 16, wherein said first and second storage states correspond, respectively, to first and second polarization states of said second ferroelectric material.

18. The method of claim 16, wherein said first and second storage states correspond, respectively, to first and second charge trapping states of said charge trapping material.

19. The method of claim 16, wherein said channel condition is determined by a value of a threshold voltage of said channel region.

20. The method of claim 19, wherein logic states are assigned to at least four different values of said threshold voltage.

\* \* \* \* \*